US006957053B1

(12) United States Patent
Moers

(10) Patent No.: US 6,957,053 B1
(45) Date of Patent: *Oct. 18, 2005

(54) METHOD FOR SELECTION OF A RECEIVER TUNING FREQUENCY

(75) Inventor: Paulus Louis Guido Moers, Eindhoven (NL)

(73) Assignee: Siemens AG, Frankfurt (DE)

( * ) Notice: Subject to any disclaimer, the term of this patent is extended or adjusted under 35 U.S.C. 154(b) by 484 days.

This patent is subject to a terminal disclaimer.

(21) Appl. No.: 09/980,220

(22) PCT Filed: Nov. 2, 2000

(86) PCT No.: PCT/EP00/01119

§ 371 (c)(1),
(2), (4) Date: Feb. 7, 2002

(87) PCT Pub. No.: WO00/74237

PCT Pub. Date: Dec. 7, 2000

(30) Foreign Application Priority Data

May 26, 1999 (EP) .................................. 99200525

(51) Int. Cl.[7] .............................................. H04B 1/18
(52) U.S. Cl. .................. 455/186.1; 455/45; 455/186.2; 455/180.4; 455/226.1; 455/226.2; 455/161.3; 455/161.2; 455/73; 455/180.2; 455/184.1; 455/188.2
(58) Field of Search .............................. 455/45, 186.1, 455/186.2, 180.4, 226.1, 226.2, 161.3, 73, 455/188.2, 161.2

(56) References Cited

U.S. PATENT DOCUMENTS

| | | | |
|---|---|---|---|
| 5,428,827 A * | 6/1995 | Kasser | 455/161.3 |
| 5,457,815 A | 10/1995 | Morewitz, II | |
| 5,493,709 A * | 2/1996 | Duckeck et al. | 455/185.1 |
| 5,577,048 A * | 11/1996 | Kasa | 370/522 |
| 5,802,066 A * | 9/1998 | Miyake et al. | 370/527 |
| 5,815,170 A * | 9/1998 | Kimura et al. | 455/186.1 |
| 5,963,563 A * | 10/1999 | Tomikura et al. | 370/486 |
| 6,038,434 A * | 3/2000 | Miyake | 455/186.1 |
| 6,064,441 A * | 5/2000 | Okamoto | 348/485 |
| 6,141,536 A * | 10/2000 | Cvetkovic et al. | 455/45 |
| 6,201,837 B1 * | 3/2001 | Okamoto | 375/316 |
| 6,363,063 B1 * | 3/2002 | Kimura et al. | 370/350 |

FOREIGN PATENT DOCUMENTS

| | | |
|---|---|---|
| DE | 41 12 705 A1 | 4/1991 |
| EP | 0 333 194 A2 | 3/1989 |
| EP | 0 459 360 A2 | 5/1991 |

* cited by examiner

*Primary Examiner*—Marceau Milord
(74) *Attorney, Agent, or Firm*—Mayer, Brown, Rowe & Maw, LLP

(57) ABSTRACT

Method for tuning the reception of radio broadcast signals to an FM RDS transmitter using program related data and transmitter related data and receiver executing the method, providing a band scanning search for detecting FM RDS transmitters exceeding a predetermined reception quality level. To enhance efficiency in data processing and use of storage capacity, transmitter related data including tuning data is stored separately from program related RDS data. Per each detected transmitter a permanency factor indicating the permanency in reception quality thereof is being allocated to each detected RDS transmitter and stored in a first memory bank, along with the relevant tuning data. Per each program identification code carried in the RDS data of the so detected transmitters program related FM RDS data are being stored in a second memorybank, a linkage code defining the storage address within the second memory bank containing the program data carried by the relevant FM RDS transmitter being allocated to the transmitter data of each FM RDS transmitter and stored in the first memory bank.

10 Claims, 3 Drawing Sheets

METHOD FOR SELECTION OF A RECEIVER TUNING FREQUENCY

FIELD OF THE INVENTION

The invention relates to a method for selecting a tuning frequency for receiving an RF transmitter within an RF frequency band and an FM receiver executing the method.

BACKGROUND OF INVENTION

An FM receiver executing the above method is on itself known e.g. from European Patent 0 333 194. The known FM receiver complies with the FM RDS broadcasting standard as defined in Specification of the Radio Data System FM RDS for VHF-FM Sound Broadcasting by the European Broadcasting Union (EBU), EBU document Tech 3244-E, March 1984 and updated in the subsequent revisions thereof. Reference is made to this document for a correct understanding of the meaning and definition of the various terms used hereinafter in connection with the FM RDS standard.

The cited FM receiver comprises a first or stationary tuner circuit and a second or scanning tuner circuit. The stationary tuner circuit is used to tune the receiver to a broadcast transmitter station with a wanted audio program, hereinafter indicated as first transmitter frequency, and to process the audio program signals for sound reproduction. If the transmitter transmits RDS data as well, then the stationary tuner circuit will also extract the RDS data carried by the received RDS transmitter signal, in particular a list of alternative frequencies (AFs). Such list provides tuning data of transmitters carrying the same program as the one the stationary tuner circuit is actually tuned to. The scanning tuner circuit is used to monitor the reception quality of the transmitter signals at each of those AFs. For this, the scanning tuner circuit is sequentially switched to each AF in the AF list to measure the fieldstrength of the transmitter signals at the respective AFs. The fieldstrength information is stored in a memory and repeatedly updated in sequential scan cycles. On deterioration of the received stationary transmitter signal, hereinafter indicated as first transmitter frequency, the stationary tuner circuit is automatically switched over in its tuning from said first transmitter frequency to another transmitter frequency, hereinafter indicated as second transmitter frequency. In the known receiver, the AF stored in the memory having highest fieldstrength is chosen to be such second transmitter frequency. However, the reception quality measurement is based on the momentary fieldstrength of the RF FM reception signal and the AF having highest fieldstrength at the moment of tuning switch over may lose this position very quickly, due to fluctuations in the environmental reception conditions. This may cause instabilities in the tuning of the receiver. Furthermore, in this known receiver, the selection of a second transmitter frequency is limited to the AFs included in the RDS AF list, being alternative frequencies carrying the same audio program as the first transmitter frequency.

An object of the invention is to improve the tuning behaviour of the above mentioned receiver.

SUMMARY OF INVENTION

To this end, a method for selecting a tuning frequency for receiving an RF transmitter within an RF frequency band is characterized by a band scanning search for detecting transmitters exceeding a predetermined reception quality level, by storing the tuning data thereof and allocating thereto a permanency factor indicating the permanency in reception quality thereof, said tuning frequency being selected on the basis of at least said permanency factor.

An FM receiver executing the method according to the invention comprising first and second tuner circuits respectively for receiving a first FM transmitter and for detecting in an FM band FM transmitters received with a reception quality exceeding a predetermined quality threshold level, and storage means for storing the tuning data of the so detected FM transmitters, the first tuner circuit switching over from an actually received first FM transmitter to a second FM transmitter selected from the detected FM transmitters when the reception quality of the first FM transmitter decreases below a predetermined level, is therefore characterized by a processing unit allocating to each detected FM transmitter a permanency factor indicating the permanency in reception quality thereof, said selection of the second FM transmitter being based on at least said permanency factor.

By the measure according to the invention the criteria for selecting a second transmitter are not only based on the reception quality or fieldstrength thereof, but also on the duration or permanency of the reception quality. The longer the reception quality is in excess of said predetermined minimum level, the more reliable and stable the reception of the transmitter signal in question is. By tuning the stationary tuner circuit to such a transmitter, the tuning behaviour of the stationary tuner will be stabilised.

To allow easy implementation, the method is preferably characterized in that the band scanning search is being repeated in subsequent scan cycles, each detected transmitter increasing respectively decreasing in permanency factor dependent on the detection respectively the absence of detection thereof in subsequent scan cycles.

An FM receiver executing said preferred method is characterized by tuning control means controlling the tuning of the second tuning circuit to repeat the band scanning search in subsequent scan cycles, the processing unit increasing, respectively decreasing, stepwise the permanency factor of a transmitter at each detection, respectively in the absence of detection, thereof in a subsequent scan cycle.

In a further preferred method the tuning data of transmitters having a permanency factor decreasing below a predetermined permanency threshold level are being erased to exclude such transmitters from being selected.

An FM RDS receiver executing said preferred method is characterized in that the storage locations of tuning data relating to transmitters decreasing in permanency factor below a predetermined permanency threshold level, being released for storage of other transmitter data.

This measure further improves the efficiency in the use of memory capacity without losing the information which transmitter frequency should be chosen in case the actually received transmitter signal decreases below said predetermined threshold level.

Furthermore, the band scanning search will reveal all transmitters in the FM band meeting the minimum reception quality requirement. This allows to apply said selection of the second transmitter frequency also when changes in the audio program are permitted or wanted. Dependent on the user's choice, such second transmitter frequency may carry an audio program signal different from the actually received one, but falling e.g. within the same PTY category, and/or including traffic messages. The selection is therewith PTY determined. RDS program codes may be used for the identification of such audio programs.

In an FM receiver capable of receiving RDS signals implementing such selection the processing unit repeatedly monitors the permanency factor of the FM transmitters carrying an audio program within the same PTY category as the audio program of the first FM transmitter.

In another preferred method according to the invention the second transmitter is selected from FM transmitters carrying traffic messages on the basis of fieldstrength in addition to the permanency factor.

In an FM receiver capable of receiving RDS signals executing this method the processing unit operates to monitor the permanency factor of FM transmitters carrying traffic message information as well as the fieldstrength thereof, the second FM transmitter being selected from the detected FM transmitters upon receiving a traffic announcement signal on the basis of fieldstrength in addition to the permanency factor.

The fieldstrength is used in this measure to identify the nearest transmitter sending traffic messages, which are most relevant to the actual location of the user because of the proximity of the transmitter.

BRIEF DESCRIPTION OF DRAWINGS

These and further aspects and advantages of the invention will be discussed in more detail hereinafter with reference to the disclosure of preferred embodiments, and in particular with reference to the appended Figures that show.

DESCRIPTION OF THE PREFERRED EMBODIMENTS

Figure 1:
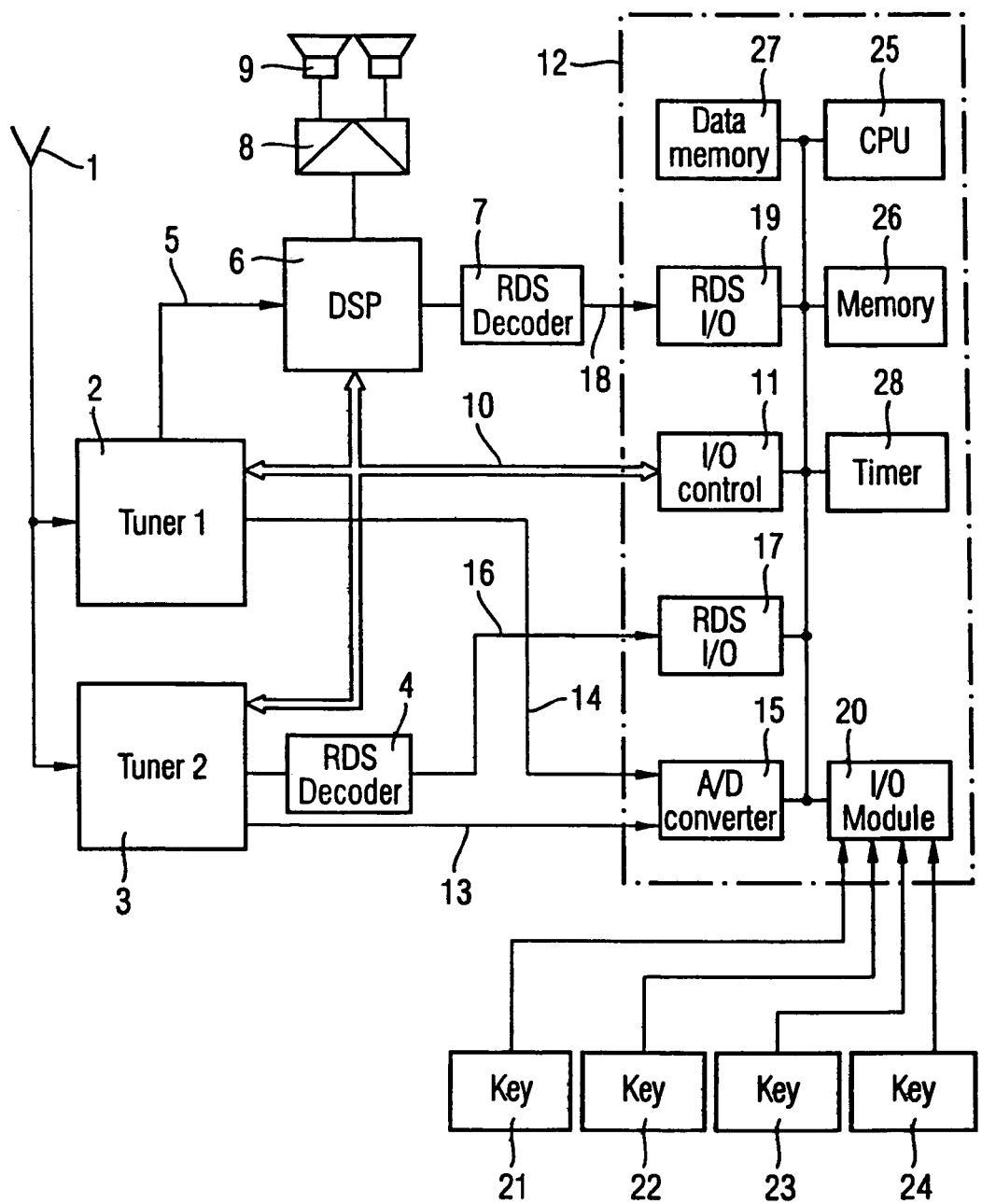
FIG. 1 a blockdiagram of a dual tuner FM RDS receiver according to the invention.

FIG. 1 shows a blockdiagram of an FM receiver according to the invention, which in the preferred embodiment as shown complies with the FM RDS broadcasting standard as defined in above cited EBU document. Reference is made to this document for detailed information on the meaning and definition of the various terms and abbreviations relating to the RDS standard, as mentioned hereinafter.

The FM receiver receives RF FM signals through an antenna 1 and following this antenna 1, it comprises first and second tuner circuits 2 and 3, the tuning frequency thereof being controlled from tuning control means 10, 11, 25. The tuning control means 10, 11, 25 comprise a central processing unit (CPU) 25 and an I/O control module 11 being included in a microprocessor 12 and connected through a control bus 10 to the first and second tuner circuits 2 and 3. By manual operation of one of keys 21–24 the tuning frequency of the first tuner circuit 2 can be set through a user interface I/O module 20 to the transmitter frequency ft of a wanted FM broadcast station. Key 21 is to activate an autostore functionality, key 22 is to activate an up/down search, key 23 is to switch on/off the reception of traffic messages and key 24 is to activate a search for programs within the same PTY category as the one actually received. These functionalities require the use of a program memory 26 for the storage of program software and a timer module 28 and are on themselves already known from e.g. the FM RDS radio receiver type VDO RC 959 RDS. The first tuner circuit 2 provides for the stationary selection and demodulation of a wanted RF FM broadcast signal into baseband and comprises means to measure the reception quality of the received FM RF signal. A quality factor reflecting said reception quality is supplied via a quality level line 14 to an AD converter module 15 of the microprocessor 12 to be further processed as described hereinafter.

Dependent on the content of the received FM broadcast signals, the baseband FM modulation signal may comprise an RDS signal and/or a mono or stereomultiplex signal. This baseband signal is supplied via a signal line 5 from an output of the first tuner circuit 2 to a digital signal processor 6. The digital signal processor 6 comprises audio signal processing means (not shown) to process mono audio signals and eventually demultiplex stereomultiplex signals into stereo left and right audio signals. These stereo left and right audio signals are supplied to an audio amplifier 8 and subsequently to a stereo loudspeaker set 9 for respectively amplification and reproduction thereof.

The digital signal processor 6 is coupled to an RDS decoder 7 to decode RDS data contained in the received FM broadcast signal. The decoded RDS data are supplied via an RDS data line 18 to an RDS data I/O module 19 of the microprocessor 12. RDS data processing occurs under control of the CPU 25 of the microprocessor 12.

Figure 2:
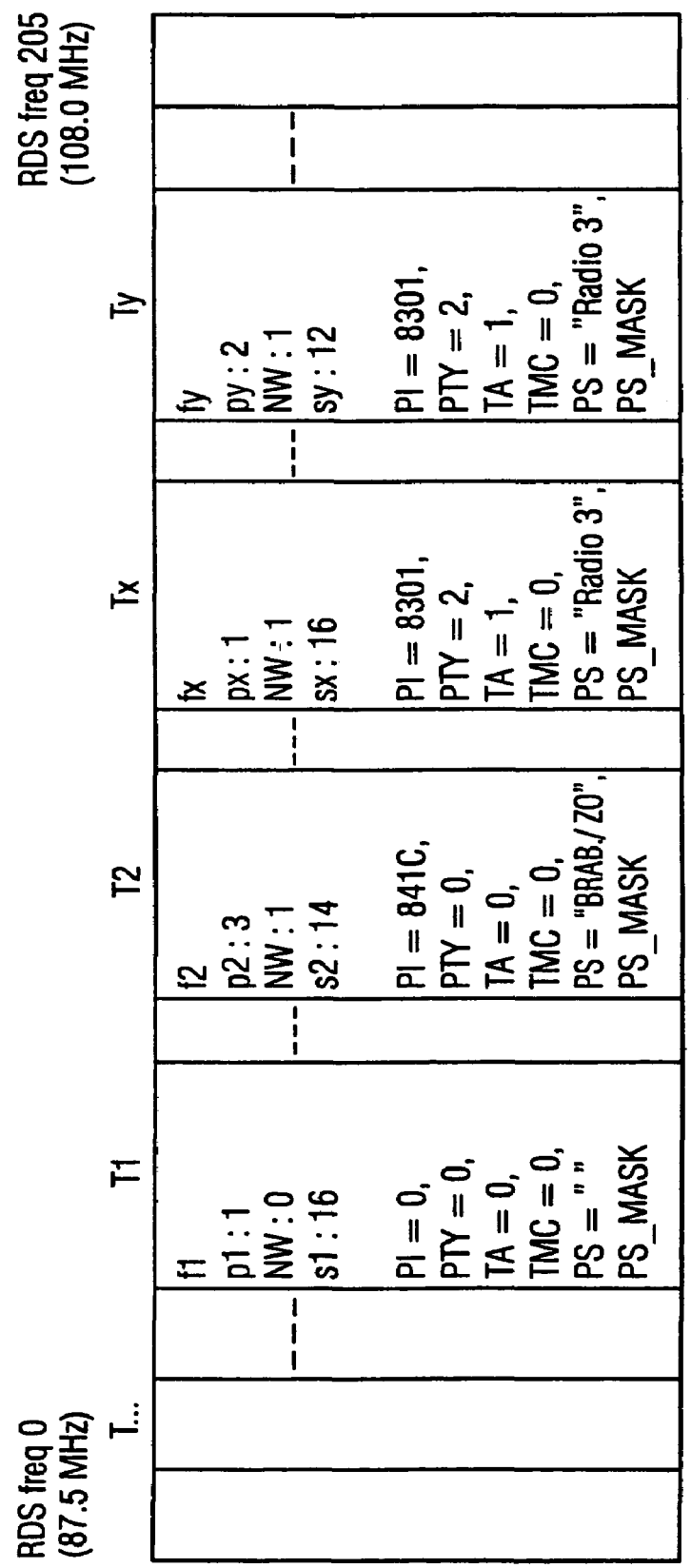
FIG. 2 an organisational scheme of the list of transmitter related data as stored in the FM RDS receiver of FIG. 1.

The tuning frequency of the second tuner circuit 3 is automatically varied by the tuning control means 10, 11, 25 to scan over the full RF FM broadcast reception band ranging from 87.5 MHz to 108 MHz, starting from e.g. the lower end of said RF FM band. The scanning operation will be interrupted upon first reception of an FM broadcast station fx having a signal reception quality exceeding a certain predetermined threshold level qt (hereinafter also indicated as scan hit). During an interruption interval, measurement, processing and storage steps are being made under control of the CPU 25, as described in the following with reference to FIG. 2.

1. the tuning data of fx is stored at a storage address Tx of a data memory 27 of the microcontroller 12;

2. a permanency factor px is being allocated to fx, set at unity value and stored at Tx;

3. the actual reception fieldstrength is measured and a fieldstrength factor sx reflecting said reception fieldstrength is stored at Tx;

An RDS decoder 4 following the output of the second tuner circuit 3 is to extract RDS data from the demodulated RDS signal, if fx is carrying such RDS data. The RDS data is supplied via an RDS data line 16 to an RDS data I/O module 17 of the microprocessor 12 and the various program related RDS codes included therein, such as e.g. the PTY-, TA-, TMC-, PS-, and/or PS Mask codes, are stored in said data memory at the storage address Tx of fx. Eventually an RDS flag NW identifying RDS transmitters with value 1 and non-RDS transmitters with value 0 may be stored in TX as well.

After these steps have been completed for fx, the scanning is resumed until it is interrupted again, when the next FM broadcast station fy in the RF FM broadcast reception band having a signal reception quality exceeding qt is detected. The above measurement, processing and storage steps are repeated for fy, the tuning data thereof, as well as a permanency factor py and a fieldstrength factor sy, eventually along with RDS program data are being stored in the data memory at storage address Ty. These steps are repeated for each such FM broadcast station until the full RF FM broadcast reception band has been scanned, whereafter the scanning operation is repeated, either in the same or in reversed scan direction.

The reception quality may be based on one or more parameters, such as e.g. the reception fieldstrength, the (lack of) multipath and other environmental sources of pollution. The above predetermined threshold level qt is chosen such, that RF FM broadcast signals exceeding this level can be processed properly without giving rise to receiver malfunctioning and/or noticeable signal distortions.

For a practical implementation of the detection of FM broadcast stations having a signal reception quality exceeding a certain predetermined threshold level qt, reference is made to above cited car radio receiver type VDO RC 959 RDS, where a similar feature is used under its so-called autostore functionality. Said known receiver also provides a reference for the measuring of the actual reception fieldstrength of certain transmitters and the storage of a fieldstrength factor sx reflecting said reception fieldstrength, the retrieval of various program related RDS codes included in the received RF FM signal, such as e.g. the PTY, TA-, TMC-, PS-, and/or PS Mask codes and the storage of these data in a data memory at storage addresses related to the relevant transmitter frequencies. The known receiver is based on a single tuner concept and provides said functionalities during short muting intervals in the reproduction of the main audio program being limited to AFs only, i.e. transmitter frequencies carrying the same audio program as the stationary received one.

If in a subsequent scan operation fx is detected again, which means that the reception quality of fx still exceeds the predetermined threshold level qt, then the permanency factor px is incremented with unity value, thus resulting in px=2. A maximum to the permanency factor can be set, e.g. at three, which means that any scan hits on fx following up to the third one in a row will have no effect on this maximum value of px=3.

If after a scan hit, fx fails to appear in a subsequent scan (hereinafter also indicated as an empty scan), then px will decrement with unity value, each time a subsequent scan appears to be empty on fx. The minimum value of px is set at px=0, which is obtained in at most three empty scans in a row. Any empty scan following the third one in a row, will have no effect on this minimum value of px=0. If px decreases below a permanency threshold level, which in this receiver is set at px=1 (unity), then all data in the data memory at the storage address Tx of fx will be removed. This removal of data is in practise effected by releasing the relevant storage locations for the storage of new data.

As long as px differs from zero, the last measured fieldstrength factor sx is stored at the storage address Tx of fx, while overwriting the prior one.

In contrast with said known receiver, the second tuner circuit 3 of the FM receiver according to the invention collects not only transmitter data of AFs only, but of all transmitters exceeding the predetermined reception quality level qt. This allows to offer the user a broader range of options in automatically selecting audio programs.

For instance, by activating the 'autostore' option with key 21, the fieldstrength factor of the various transmitters stored in the data memory may be compared with a certain threshold level, chosen such that it is exceeded by only a limited number of transmitters (e.g. 10), which can be RDS- or non-RDS transmitters. The tuning data of these transmitters are stored in the autostore memory and called up by touching the key 21. According to the invention the threshold level may based on a predetermined threshold value for the permanency factor, eventually in combination with a predetermined threshold value for the fieldstrength factor. This also applies to the threshold level for use in the up/down search of transmitters, which feature can be activated with key 22.

The various program related RDS codes like PTY, TP and TA are used to offer the user options in automatically selecting within the category of programs indicated therewith, the best receivable transmitter from those having these codes stored in the data memory of the receiver. The availability of the tuning data of all receivable transmitters in the data memory of the receiver, together with the permanency factor and the fieldstrength factor thereof allow to immediately identify within a certain RDS program category, which in terms of these factors is the best to receive transmitter.

A switching of the tuning of the first tuner circuit 2 to the best to receive transmitter carrying a program within the same PTY category as the one the first tuner is actually tuned to, is activated with key 24.

By an operation of key 23, the receiver can be set to reproduce traffic messages. In accordance with the invention, the criterium to select an appropriate traffic message transmitting RDS broadcast station amongst those carrying the traffic announcement flag is based on the permanency factor, i.e. the best to receive RDS traffic message broadcast station having the highest permanency factor. If the highest permanency factor is shared by various transmitters, then the fieldstrength factor may additionally used to come to the one best to receive. The transmitter received strongest (i.e. with highest fieldstrength) is in practise nearest to the receiver location and the traffic messages of that transmitter are therewith most relevant to the user.

Figure 3:
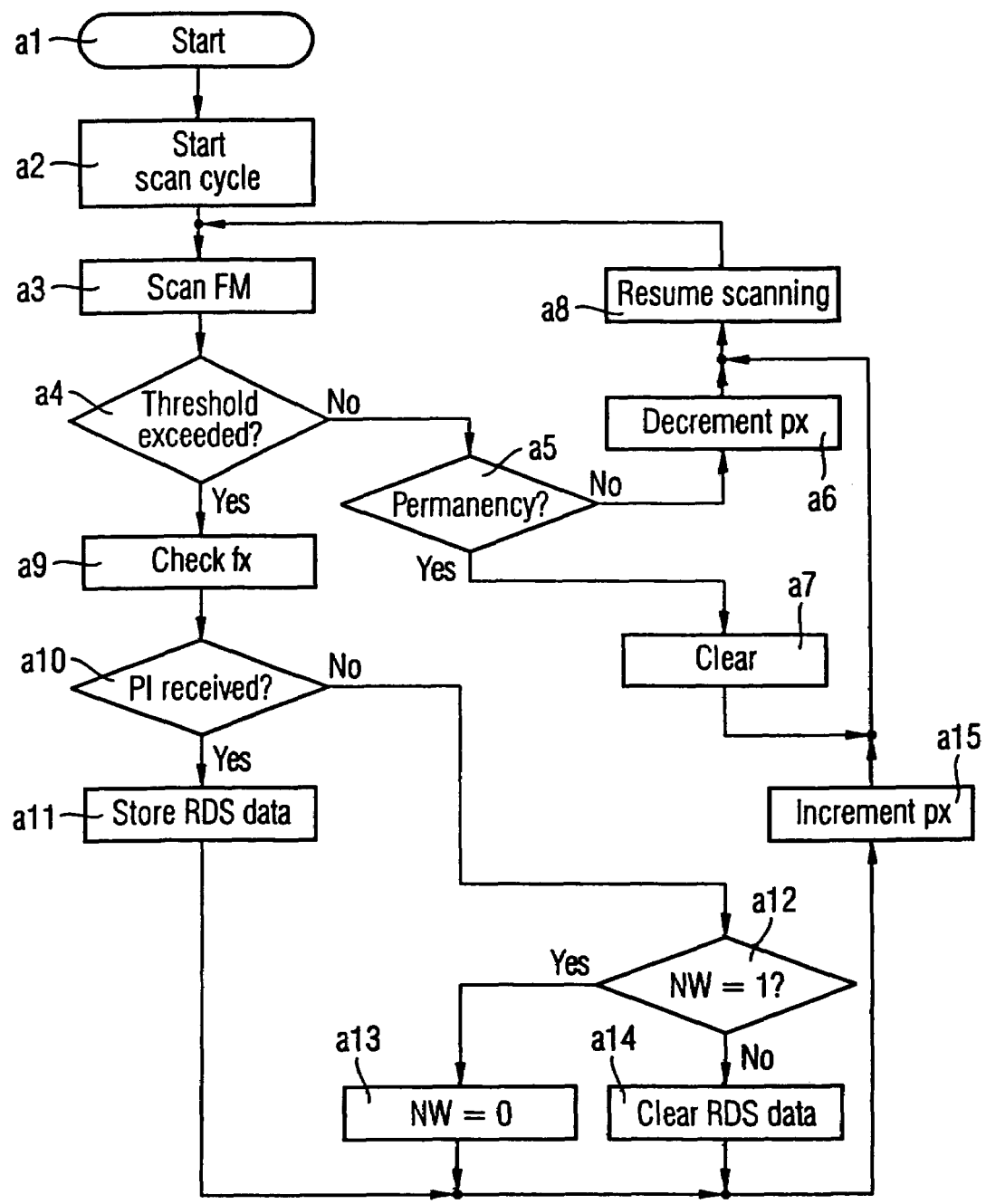
FIG. 3 a flowchart illustrating the method according to the invention as being executed by the FM RDS receiver of FIG. 1.

FIG. 3 shows a flowchart of an algorithm for collecting and updating transmitter and RDS program related data to be used in a method for tuning the reception of radio broadcast signals to an FM transmitter in accordance with the invention, in which steps a1–a15 have the following meaning:

a1 Switching on the radio and starting the method according to the invention.

for selecting a tuning frequency for receiving an RF FM transmitter within an RF FM frequency band a2 The second tuner circuit 3 is initialised for starting a scan cycle from the lower end of the FM frequency band at 87.5 MHz. The data memory 27 is initialised for transmitter and RDS program related data storage a3 The tuning frequency of the second tuner circuit 3 is being increased to scan the FM and interrupted upon reception of a transmitter fx. During an interruption period the signal reception quality (this can be the fieldstrength or other parameters defining the reception quality level) of fx is measured. In the following the fieldstrength is taken as a measure for the reception quality. Store a fieldstrength factor sx reflecting the fieldstrength of fx at a storage address Tx of the data memory 27.

a4 If the fieldstrength factor sx exceeds the threshold level qt then go to a9. Otherwise go to a5.

a5 The fieldstrength factor sx is not good enough. Check now the permanency factor px of fx. If this px is not equal to zero (which means fx has been detected in at least the preceding scan), then go to a6. If px=0 then go to a7.

a6 Decrement px with unity value.

a7 px=0: clear all data from the storage address Tx of the data memory 27.

a8 Resume the scanning operation. If the end of the FM band (108, 0 MHz) is reached, go to a3 to start a subsequent scan cycle, starting again from the lower end of the FM band (87.5 MHz).

a9 The fieldstrength factor sx exceeds qt. Wait some time to check whether fx carries RDS information.

a10 Is the PI code received. If so, go to a11, otherwise go to a 12.

a11 Set the RDS flag NW at 1 and store all RDS data at Tx of data memory 27.

a12 Check the RDS flag NW at Tx. If NW=1, go to a13, otherwise go to a14.

a13 Clear the RDS flag by setting NW to 0.

a14 Clear all RDS data at Tx a15 The reception quality was OK. Increment px with unity value (until maximum at px=3 has been reached).

The data memory 27 therewith contains at any time the most recent status of the receivable transmitters in the FM band in terms of momentary reception quality or fieldstrength sx and permanency or stability of reception quality px. The continuous availability of the abovementioned transmitter related data in an FM receiver according to the invention allows to determine immediately which transmitter within the FM band provides optimal reception conditions, i.e. which transmitter within the FM band has highest permanency factor px. If the highest px value is shared by several transmitters, then the fieldstrength factor sx may be taken additionally to determine the best to receive transmitter. The availability of program related RDS data allows to restrict the group of transmitters to be considered for the above determination of the best to receive transmitter. If, for instance, the user is only interested in hearing a specific audio program with optimal quality, then in accordance with the invention it should be determined, which transmitter having the PI code identifying said specific audio program has highest permanency factor px amongst those detected within the FM band. Similarly, the group of transmitters to be considered for the above determination in case the user is interested in any audio program within a certain PTY category, is limited to those transmitter carrying the RDS PTY code of said category. Accordingly, in determining the best to receive traffic message broadcast transmitter station, use can be made of the RDS TA code to limit the group of transmitters to be considered therefor.

The invention is not restricted to the embodiments described above and may well be used in e.g. a non-RDS receiver for implementing an 'autostore' functionality, wherein a number of strongest transmitters are being stored under a same number of tuner preselection keys. Furthermore, the functions of the first and second tuner circuits 2 and 3 may well be performed with a single tuner, in which the stationary reception is repeatedly shortly interrupted to allow the tuner during each interruption period to scan through a part of the FM band covering the whole FM band after a number of interruption periods.

What is claimed is:

1. A method for selecting a tuning frequency for receiving an RF transmitter within an RF frequency band, the method comprising:
    periodically performing a band scanning search to detect transmitters exceeding a predetermined reception quality level;
    storing the tuning data for the detected transmitters;
    allocating a permanency factor indicating the permanency in reception quality for the transmitters exceeding the predetermined reception quality level and based on the number of times the transmitter exceeds the predetermined reception quality in the band scanning searches; and
    selecting a tuning frequency on the basis of the permanency factor.

2. A method according to claim 1 wherein the band scanning search is repeated in subsequent scan cycles, and each detected transmitter increasing or decreasing respectively in permanency factor depending on the detection or the absence of detection respectively in subsequent scan cycles.

3. A method according to claim 2 further comprising erasing the tuning data of transmitters having a permanency factor decreasing below a predetermined permanency threshold level.

4. A method according to claim 1 further comprising selecting an RF transmitter from the detected transmitters carrying audio programs belonging to a predetermined PTY category.

5. A method according to claim 1 further comprising selecting an RF transmitter from the detected FM transmitters carrying traffic messages on the basis of field strength.

6. An FM receiver comprising:
    a first tuner circuit for receiving a first FM transmitter;
    a second tuner circuits for periodically detecting FM transmitter signals received with a reception quality exceeding a predetermined quality threshold level in an FM band;
    storage means for storing the tuning data of the detected FM transmitters, wherein the first tuner circuit switches over from an actually received first FM transmitter to a second FM transmitter selected from the detected FM transmitters when the reception quality of the first FM transmitter decreases below a predetermined level;
    a processing unit which allocates a permanency factor indicating the permanency in reception quality to each detected FM transmitter, the permanency factor based on the number of times when the detected FM transmitter exceeds the predetermined level after the initial detection and wherein the selection of the second FM transmitter is based on the permanency factor.

7. An FM receiver according to claim 6, further comprising a tuning control means for varying the tuning of the second tuner circuit to repeat the band scanning search in subsequent scan cycles and wherein the processing unit increases stepwise the permanency factor of the transmitter at each detection or decreases the permanency factor stepwise in the absence of detection of the transmitter in a subsequent scan cycle.

8. An FM receiver according to claim 7, wherein the storage locations of the tuning data relating to transmitters decreasing in permanency factor below a predetermined permanency threshold level are released for storage of other transmitter data in the storage means.

9. An FM receiver according to claim 6 wherein the FM receiver is capable of receiving RDS signals and wherein when selecting the second FM transmitter, the processing unit continuously monitors the permanency factor of the FM transmitters carrying an audio program in the same PTY category as the audio program of the first FM transmitter.

10. An FM receiver according to claim 6 wherein the FM receiver is capable of receiving RDS signals, and wherein the processing unit operates to monitor the permanency factor of FM transmitters carrying traffic message information as well as the field strength thereof, the second FM transmitter being selected from the detected FM transmitters upon receiving a traffic announcement signal on the basis of field strength.

* * * * *

UNITED STATES PATENT AND TRADEMARK OFFICE
CERTIFICATE OF CORRECTION

PATENT NO. : 6,957,053 B1  
APPLICATION NO. : 09/980220  
DATED : October 18, 2005  
INVENTOR(S) : Paulus Louis Guido Moers It is certified that error appears in the above-identified patent and that said Letters Patent is hereby corrected as shown below:

Title page item (22) PCT Filed: "Nov. 2, 2000" -- Date should read --February 11, 2000--

Signed and Sealed this

Second Day of January, 2007

JON W. DUDAS  
*Director of the United States Patent and Trademark Office*